(12) United States Patent
Kozyra et al.

(10) Patent No.: US 6,886,627 B2
(45) Date of Patent: May 3, 2005

(54) RADIAL HEAT SINK WITH HELICAL SHAPED FINS

(75) Inventors: Kazimierz L. Kozyra, Olympia, WA (US); Daniel P. Carter, Bainbridge Island, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/608,056

(22) Filed: Jun. 27, 2003

(65) Prior Publication Data

US 2004/0261975 A1   Dec. 30, 2004

(51) Int. Cl.[7] .............................................. H05K 7/20
(52) U.S. Cl. ..................... 165/80.3; 165/185; 361/697; 361/704
(58) Field of Search .............................. 165/80.3, 121, 165/185; 361/697, 704; 257/719, 722; 174/16.3

(56) References Cited

U.S. PATENT DOCUMENTS

| | | | | |
|---|---|---|---|---|
| 3,023,264 A | * | 2/1962 | Allison | 174/35 TS |
| 3,030,292 A | * | 4/1962 | Ludolf | 376/454 |
| 3,231,477 A | * | 1/1966 | Saunders et al. | 376/453 |
| 5,313,099 A | * | 5/1994 | Tata et al. | 257/717 |
| 5,397,919 A | * | 3/1995 | Tata et al. | 257/717 |
| 6,640,882 B1 | * | 11/2003 | Dowdy et al. | 165/80.3 |
| 2002/0046826 A1 | * | 4/2002 | Kao | 165/104.33 |
| 2003/0048608 A1 | * | 3/2003 | Crocker et al. | 361/697 |
| 2003/0131970 A1 | * | 7/2003 | Carter et al. | 165/80.3 |

FOREIGN PATENT DOCUMENTS

EP                    0833179 A2 *  12/1998

* cited by examiner

*Primary Examiner*—Allen Flanigan
(74) *Attorney, Agent, or Firm*—Schwegman, Lundberg, Woessner & Kluth, P.A.

(57) ABSTRACT

An electronic assembly includes an integrated circuit (e.g., a processor) mounted on a substrate (e.g., a motherboard), and a radial heat sink thermally coupled to the integrated circuit. The radial heat sink includes a core having an outer surface, and a plurality of helical fins that extend from the outer surface of the core. The electronic assembly may include a fan positioned near the heat sink. The appropriate angle for the helical fins relative to the longitudinal axis of the heat sink depends in part on the direction of the airflow that is produced by the fan.

13 Claims, 2 Drawing Sheets

RADIAL HEAT SINK WITH HELICAL SHAPED FINS

TECHNICAL FIELD

This invention relates generally to a radial heat sink, and more particularly to a radial heat sink with helical fins.

BACKGROUND

Electronic devices generate heat during operation. Thermal management refers to the ability to keep temperature-sensitive elements in an electronic device within a prescribed operating temperature.

Historically, electronic devices have been cooled by natural convection. The cases or packaging of the devices included strategically located openings (e.g., slots) that allowed warm air to escape and cooler air to be drawn in.

The advent of high performance electronic devices, such as processors, now requires more innovative thermal management. Each increase in processing speed and power generally carries a "cost" of increased heat generation such that natural convection is no longer sufficient to provide proper thermal management. If the heat generated by such electronic devices is not removed at a sufficient rate, the devices may overheat, resulting in damage to the devices (e.g., diminished service life), and/or a reduction in operating performance of the devices.

One common method of cooling electronic devices includes thermally coupling a heat sink to the electronic device. A typical heat sink includes protrusions, such as fins or pins (commonly referred to as extended surfaces), which project from a body of the heat sink. The protrusions give the heat sink a larger surface area such that the heat sink dissipates a greater amount of thermal energy from the electronic device into the surrounding environment. Heat sinks are fabricated from materials with high thermal conductivity in order to efficiently transfer thermal energy from the electronic device to the ambient environment.

A fan is often used in conjunction with the heat sink to improve the heat sink's rate of cooling. The fan, which is typically mounted near the heat sink, causes air to move past the fins on the heat sink. Moving air past the heat sink increases the rate of convection between the heat sink and the ambient environment where the heat sink is located. Increasing the rate of convection between the heat sink and the ambient environment reduces the temperature of the heat sink, thereby enhancing the heat sink's ability to transfer heat from the electronic device.

One drawback with conventional heat sinks is that when airflow is generated by a fan near the heat sink, the airflow is not efficiently utilized by the heat sink. Accordingly, there is a need for a heat sink that is able to make the most of the airflow generated by a fan near the heat sink in order to improve the rate cooling rate of the heat sink.

DETAILED DESCRIPTION

Figure 1:
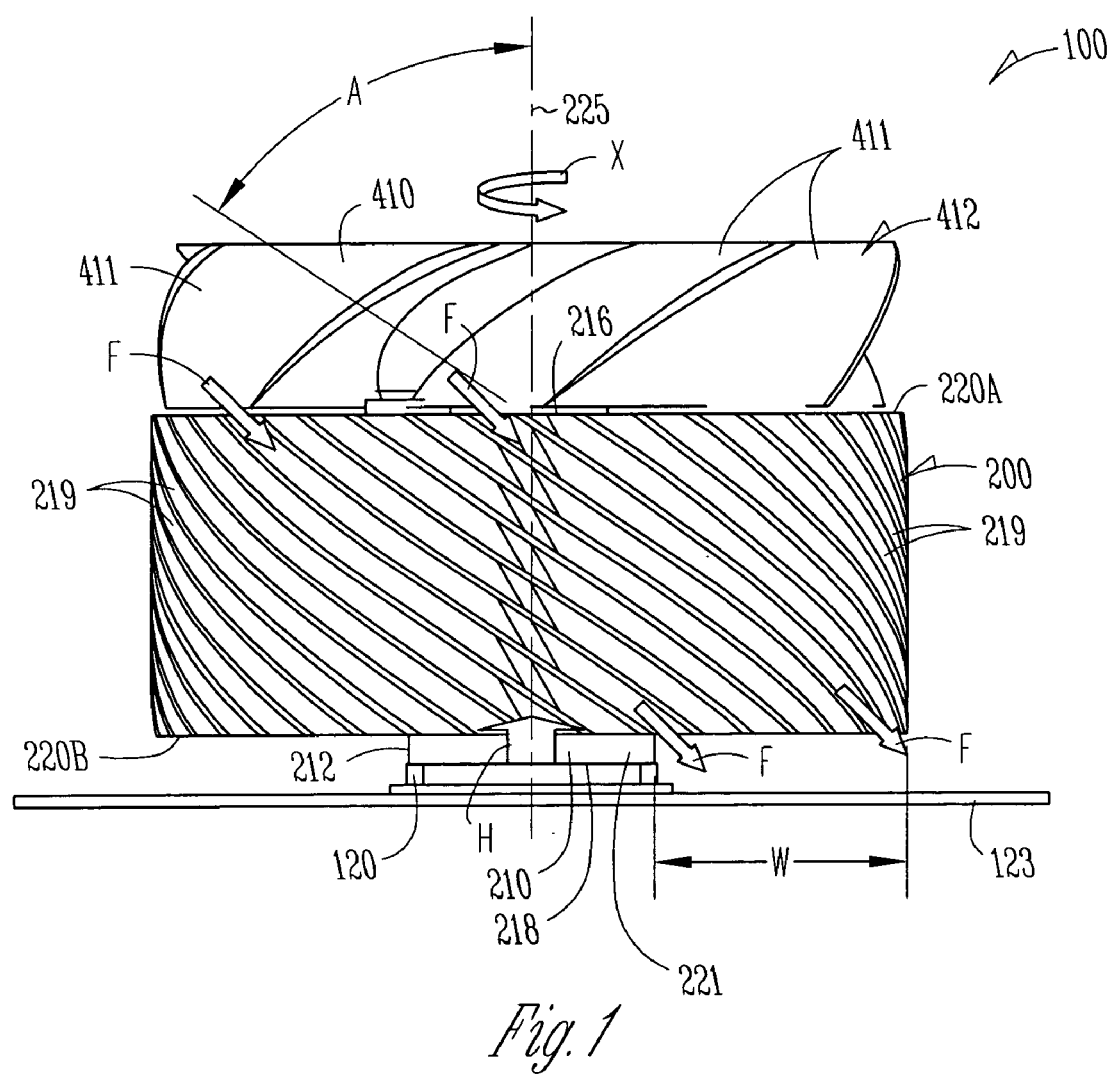
FIG. 1 is an elevation view of an electronic assembly.

In the following detailed description, reference is made to the accompanying drawings which form a part hereof, and in which is shown by way of illustration specific embodiments in which the inventions may be practiced. In the drawings, like numerals describe substantially similar components throughout the several views. These embodiments are described in sufficient detail to enable those skilled in the art to practice the invention. Other embodiments may be utilized and mechanical, logical, electrical, and other changes may be made without departing from the spirit and scope of the present invention. The following detailed description is, therefore, not to be taken in a limiting sense, and the scope of the present invention is defined only by the appended claims, along with the full scope of equivalents to which such claims are entitled.

A radial heat sink that includes helical fins is described herein. The helical fins spiral around a thermally conductive core such that airflow generated from above the heat sink (e.g., by an overhead fan) is efficiently distributed over the helical fins to improve the rate of convection between the heat sink and the ambient air.

FIG. 1 shows an electronic assembly 100 that includes an integrated circuit (e.g., processor 120) that is mounted on a substrate (e.g., motherboard 123). The electronic assembly further includes a radial heat sink 200 that is thermally coupled to the processor 120. Radial heat sink 200 includes a thermally conductive core 210 having an outer surface 212 and a plurality of non-planar helical fins 219 that extend from the outer surface 212 of core 210. The interface between processor 120 and radial heat sink 200 may further include other components, including but not limited to, thermal interfaces (e.g., thermal grease and phase-change materials) and integrated heat spreaders.

In the illustrated example embodiment, electronic assembly 100 further includes a fan 410 that is positioned near the heat sink 200. Although an axial fan 410 is shown, the invention is not limited to axial fans. Any type of fan may be used, including a centrifugal fan or a blower.

Figure 2:
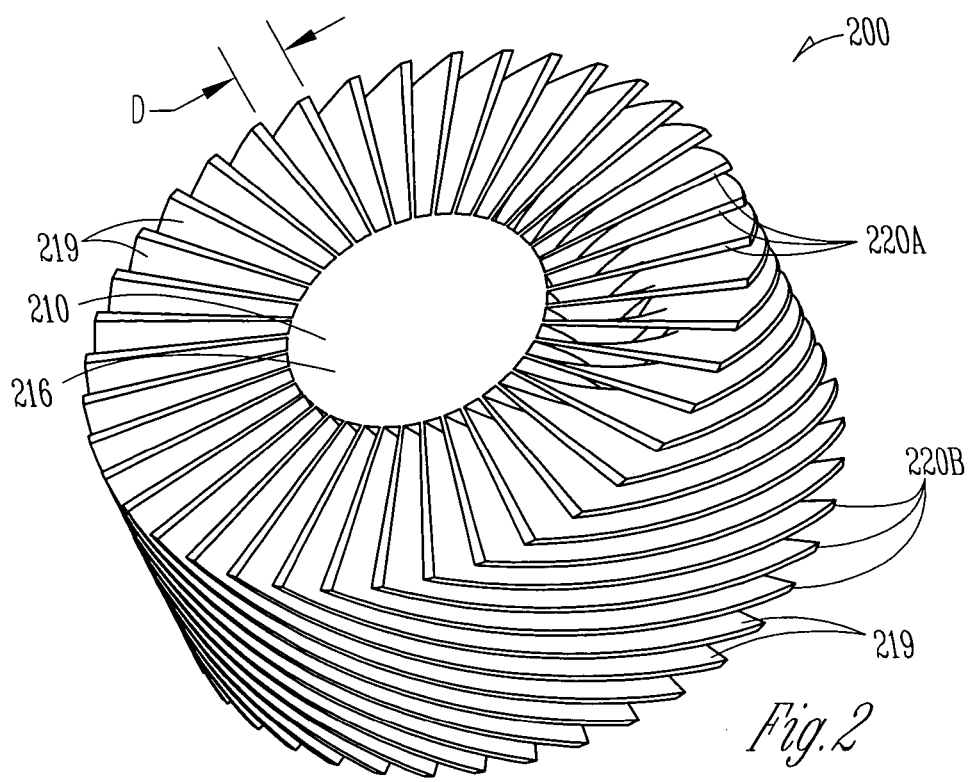
FIG. 2 is a perspective view illustrating the example heat sink that is used in the electronic assembly shown in FIG. 1.
Figure 3:
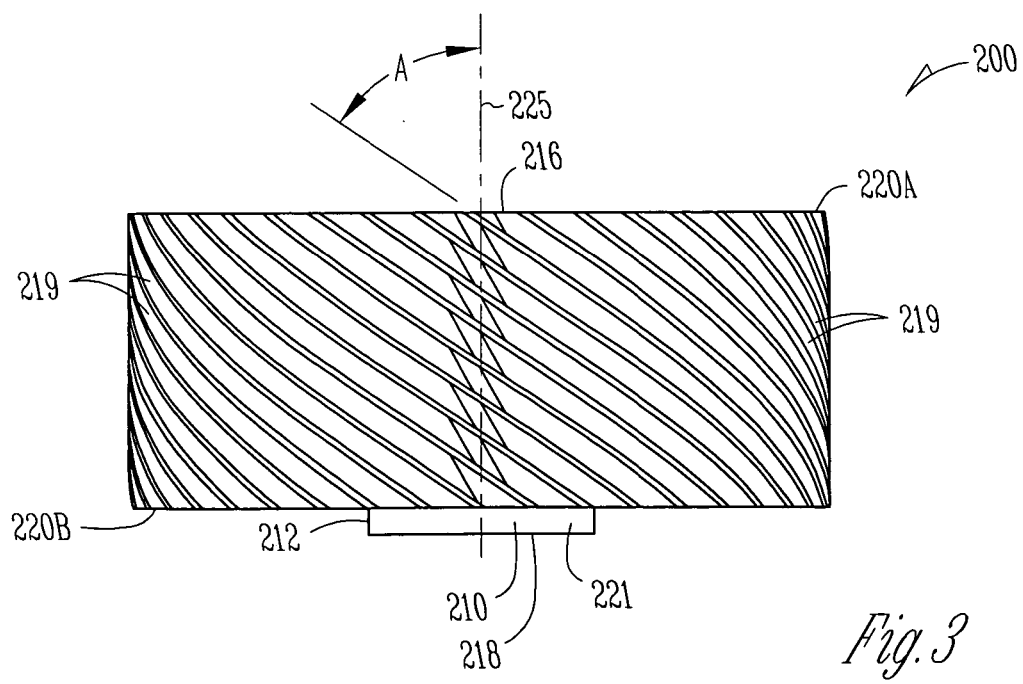
FIG. 3 is an elevation view of the example heat sink shown in FIG. 2.

The example radial heat sink 200 that is shown in the electronic assembly 100 illustrated in FIG. 1 will now be described in greater detail with reference to FIGS. 2 and 3 as well as FIG. 1. Core 210 may have any suitable size and configuration, including cylindrical, conical, square, rectangular, or any other shape that facilitates mounting radial heat sink 200 onto processor 120 to remove heat (designated by arrow H in FIG. 1) from processor 120. In the illustrated example embodiment, core 210 is a cylindrical rod having a diameter and a height that depend in part on the size of processor 120.

In other embodiments, core 210 may be a tube, or include heat transport mediums, such as one or more heat pipes, a liquid, a thermo-siphon, and/or any other heat transport medium that enhances heat dissipation. Material choices for core 210 include any type of thermally conductive material, such as aluminum and copper.

The heat sink 200 may include any number of fins 219. The number of fins 219 will depend on the particular application. In one embodiment, heat sink 200 includes at least five fins 219, and may include about thirty to forty fins 219. In the illustrated embodiment, the helical fins 219 spiral around the thermally conductive core 210 at a substantially uniform pitch.

Fins 219 can be of any suitable thickness and size. In the illustrated embodiment, each helical fin 219 has a similar width W, although one or more of the fins 219 may also be of varying dimensions. It should be noted that the fins 219 may be made from the same types of materials noted above for the core 210, i.e., any type of material known to conduct heat, such as aluminum and copper.

As discussed above, thermally conductive core 210 includes an outer surface 212, and further includes a top surface 216, a bottom surface 218 and a longitudinal axis 225 that is the same as the longitudinal axis of the heat sink 200. The helical fins 219 include opposing edges 220A, 220B. In some embodiments, at least one of the opposing edges 220A, 220B is aligned with at least one of the top and bottom surfaces 216, 218 of the core 210. In the illustrated embodiment, edges 220A are aligned with the top surface 216 of the core 210, and the core 210 extends below the opposing edges 220B such that a portion 221 of the core 210 is exposed (see FIGS. 1 and 3).

In some sample embodiments, the angle A (see FIGS. 1 and 3) between the longitudinal axis 225 of heat sink 200 and helical fins 219 is between about 30 and 60 degrees. In the embodiment shown in FIGS. 2 and 3, the angle A is at approximately 45 degrees relative to the longitudinal axis 225 of heat sink 200. The appropriate angle A for the helical fins 219 depends in part on the type of overhead fan 410 (e.g., the number of fins, fin size, and fin design) that is used in the electronic assembly 100.

The distance D (see FIG. 2) between the fins will also vary depending on the (i) number of fins 219; (ii) size of the core 210 and fins 219; and (iii) angle A between the helical fins 219 and the longitudinal axis 225 of heat sink 200. The determination of these and other fin structure attributes is unique to each fan and heat sink geometry, as well as to the particular application in which these components are used.

As shown in FIG. 1, arrow X indicates the direction of fan 410 rotation, and arrows F illustrate airflow F that is generated by fan 410 as the airflow F passes through heat sink 200. Depending on the particular application, the fan 410 may alternatively be rotating in the opposite direction such that the fins 219 would be oriented in the opposite direction to be appropriately aligned with the airflow F.

In the illustrated example embodiment, the longitudinal axis 225 of the fan 410 is substantially aligned with the longitudinal axis 225 of the heat sink 200. In addition, helical fins 219 are oriented in substantially the same direction as the direction of the airflow F from fan 410. The direction of the airflow F will initially depend on the geometry of the blades 411 that form the impeller 412 on the fan 410 (see FIG. 1).

As an example, the helical fins 219 may be oriented at an angle A that is substantially between 30 and 60 degrees relative to the longitudinal axis 225 of the thermally conductive core 210, and the plurality of blades 411 on the impeller 412 of fan 410 generate an airflow that is oriented at substantially the same angle relative to the longitudinal axis 225 of fan 410 as the angle A of the helical fins 219 relative to the longitudinal axis 225 of heat sink 200.

The airflow coming from the fan 410 has two components. As discussed above, the direction of one component will be at an angle relative to the longitudinal axis 225 of the fan 410 with the angle depending on the geometry of the blades 411 that form the impeller 412 on the fan 410. The airflow will also include a second "swirl" component that is imparted to the airflow due to the rotation of the blades 411. The airflow coming from the fan 410 continues to rotate as it moves downstream.

Many of the available benefits from the airflow are lost in current heat sink designs due to the impedance caused by redirecting the airflow. Orienting the fins 219 in a helical manner allows the fins 219 to be aligned with the airflow, and complements the natural tendency of the airflow to swirl, resulting in lower airflow impedance.

Reducing the impedance of the airflow increases the airflow rate over helical fins 219. The increased airflow rate over the fins 219 raises the rate of convection between heat sink 200 and the ambient air. Increasing the convection rate between heat sink 200 and the ambient air lowers the temperature of heat sink 200, thereby improving the cooling capacity of heat sink 200.

Reducing the impedance of the airflow also decreases the amount of noise that is generated by the airflow. The noise caused by the airflow decreases because of a reduction in chaotic/turbulent airflow through heat sink 200.

A method of removing heat from an integrated circuit will now be described with reference to FIGS. 1–3. The method includes thermally coupling a heat sink 200 to the integrated circuit (e.g., processor 120). The heat sink 200 includes a thermally conductive core 210 having an outer surface 212, and a plurality of helical fins 219 that extend from the outer surface 212 of the core 210. The method further includes positioning a fan 410 near heat sink 200 to generate an airflow F over helical fins 219. It should be noted that thermally coupling heat sink 200 to processor 120 may include a thermally coupling core 210 to processor 120.

In some sample embodiments of the method, positioning fan 410 near heat sink 200 includes aligning a longitudinal axis 225 of fan 410 with the longitudinal axis 225 of heat sink 200. In addition, the helical fins 219 may be oriented at an angle A, which is substantially between 30 and 60 degrees relative to the longitudinal axis 225 of heat sink 200, such that positioning fan 410 near heat sink 200 includes orienting fan 410 to generate an airflow F that is at substantially the same angle relative to the longitudinal axis 225 of heat sink 200 as the angle A of the helical fins 219 is relative to the longitudinal axis 225 of heat sink 200.

The above-described heat sinks and methods provide, among other things, enhanced heat dissipation by using a plurality of helical fins that spiral around a core. The helical fins improve the efficiency of the heat sink, especially when the heat sink is used in conjunction with an appropriate fan mounted above the heat sink. The radial heat sinks described herein may be combined with a variety of processors, or other electrical devices, to form efficient electronic assemblies.

As discussed above, an electronic assembly is formed when electronic components, such as integrated circuits, are assembled into packages by physically and electrically coupling them to a substrate, such as a motherboard. It should be noted that electronic assemblies may be incorporated into many types of electronic systems. Example electronic systems include, but are not limited to, computers (e.g., desktop, laptop, hand-held, server, Internet appliance, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, Motion Picture Experts Group, Audio Player 3 (MP3) players, and the like.

While certain operations have been described herein relative to "upper" and "lower" surfaces or "top" and "bottom" surfaces, it will be understood that these descriptors are relative, and that they would be reversed if the relevant structure(s) were inverted. Therefore, these terms are not intended to be limiting.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An electronic assembly comprising:
   a substrate;
   an integrated circuit mounted on the substrate; and
   a heat sink thermally coupled to the integrated circuit, the heat sink including a thermally conductive core having an outer surface and a plurality of non-planar helical fins extending from the outer surface of the core, the non-planar helical fins being oriented at an angle substantially between 30 and 60 degrees relative to a longitudinal axis of the heat sink; and
   a fan having a longitudinal axis, the longitudinal axis of the fan being substantially aligned with the longitudinal axis of the heat sink, the fan including an impeller having a plurality of blades that create an airflow as the impeller rotates, the airflow generated by the plurality of blades being oriented at substantially the same angle relative to the longitudinal axis of the fan as the angle of the non-planar helical fins is relative to the longitudinal axis of the heat sink.

2. The heat sink of claim 1 wherein the non-planar helical fins are oriented at an angle of about 45 degrees relative to the longitudinal axis of the heat sink.

3. The heat sink of claim 1 wherein the core is a cylindrical rod.

4. The heat sink of claim 1 wherein the non-planar helical fins spiral around the thermally conductive core at a substantially uniform pitch.

5. The heat sink of claim 1 wherein the non-planar helical fins have a similar width.

6. The heat sink of claim 1 wherein the heat sink includes at least 5 non-planar helical fins.

7. The heat sink of claim 1 wherein the core includes a top surface and a bottom surface and the non-planar helical fins includes opposing edges, at least one of the opposing edges being aligned with at least one of the top and bottom surfaces of the core.

8. The heat sink of claim 1 wherein the core is cylindrical.

9. A method of removing heat from an integrated circuit, the method comprising:
   thermally coupling a heat sink to the integrated circuit, the heat sink including a thermally conductive core having an outer surface and a plurality of non-planar helical fins that extend from the outer surface of the core, the non-planar helical fins being oriented at an angle substantially between 30 and 60 degrees relative to a longitudinal axis of the heat sink; and
   positioning a fan near the heat sink to generate airflow over the non-planar helical fins of the heat sink, wherein positioning a fan near the heat sink includes orienting the fan to generate an airflow that is at substantially the same angle relative to the longitudinal axis of the heat sink as the angle of the non-planar helical fins is relative to the longitudinal axis of the heat sink.

10. The method of claim 9 wherein positioning a fan near the heat sink includes aligning a longitudinal axis of the fan with the longitudinal axis of the heat sink.

11. The method of claim 9 wherein thermally coupling a heat sink to the integrated circuit includes thermally coupling the thermally conductive core of the heat sink to the integrated circuit.

12. A method of removing heat from an integrated circuit, the method comprising:
   thermally coupling a heat sink to the integrated circuit, the heat sink including a thermally conductive core having an outer surface, and a plurality of non-planar helical fins that extend from the outer surface of the core, the non-planar helical fins being oriented at an angle substantially between 30 and 60 degrees relative to a longitudinal axis of the heat sink; and
   positioning a fan near the heat sink to generate airflow over the non-planar helical fins of the heat sink, wherein positioning a fan near the heat sink includes aligning a longitudinal axis of the fan with the longitudinal axis of the heat sink and orienting the fan to generate an airflow that is at substantially the same angle relative to the longitudinal axis of the heat sink as the angle of the non-planar helical fins is relative to the longitudinal axis of the heat sink.

13. The method of claim 12 wherein thermally coupling a heat sink to the integrated circuit includes thermally coupling the thermally conductive core of the heat sink to the integrated circuit.

* * * * *